(12) United States Patent
Conley et al.

(10) Patent No.: US 7,409,473 B2
(45) Date of Patent: Aug. 5, 2008

(54) OFF-CHIP DATA RELOCATION

(75) Inventors: Kevin M. Conley, San Jose, CA (US); Peter John Smith, Midlothian (GB)

(73) Assignee: SanDisk Corporation, Milpitas, CA (US)

( * ) Notice: Subject to any disclaimer, the term of this patent is extended or adjusted under 35 U.S.C. 154(b) by 251 days.

(21) Appl. No.: 11/022,462

(22) Filed: Dec. 21, 2004

(65) Prior Publication Data
US 2006/0136687 A1    Jun. 22, 2006

(51) Int. Cl.
  *G06F 13/14* (2006.01)
(52) U.S. Cl. .............................. 710/38; 710/31; 710/36; 710/65; 710/52
(58) Field of Classification Search .................. 711/165
  See application file for complete search history.

(56) References Cited

U.S. PATENT DOCUMENTS

| | | | |
|---|---|---|---|
| 4,251,863 | A | 2/1981 | Rothenberger |
| 5,233,616 | A | 8/1993 | Callander |
| 5,267,242 | A | 11/1993 | Lavallee et al. |
| 5,274,646 | A | 12/1993 | Brey et al. |
| 5,465,235 | A | 11/1995 | Miyamoto |
| 5,586,285 | A | 12/1996 | Hasbun |
| 5,692,165 | A * | 11/1997 | Jeddeloh et al. ............. 713/400 |
| 5,734,816 | A | 3/1998 | Niijima et al. |
| 5,740,394 | A | 4/1998 | Minemura et al. |
| 5,768,194 | A | 6/1998 | Matsubara et al. |
| 5,822,245 | A | 10/1998 | Gupta et al. |
| 5,890,192 | A | 3/1999 | Lee et al. |
| 5,893,135 | A * | 4/1999 | Hasbun et al. ............... 711/103 |
| 5,930,167 | A | 7/1999 | Lee et al. |
| 6,012,122 | A | 1/2000 | Choi et al. |
| 6,021,463 | A | 2/2000 | Belser |
| 6,029,233 | A * | 2/2000 | Abily et al. .................. 711/165 |
| 6,040,997 | A | 3/2000 | Estakhri |

(Continued)

FOREIGN PATENT DOCUMENTS

DE         246857        6/1987

(Continued)

OTHER PUBLICATIONS

Derwent Abstract of JP-229924A, Derwent acc. No. 2002-639959, 2002.*

(Continued)

*Primary Examiner*—B. James Peikari
(74) *Attorney, Agent, or Firm*—Davis Wright Tremaine LLP

(57) ABSTRACT

The on-chip copy process is extended so that the data may be copied between two blocks that may be on different chips, different planes on the same chip, or the same plane of the same chip. More specifically, the methods described here provide a single data copying mechanism that allows data to be copied between any two locations in a memory system. An exemplary embodiment uses an EDO-type timing. According to another aspect, selected portions of the relocated data, such as chosen words in a transferred page, can be updated in the controller on the fly. In addition to transferring a data set directly from a read buffer of a source array to a write buffer of a destination array, the data set can concurrently be copied, if desired, into the controller where an error detection and correction operation can be performed on it.

10 Claims, 12 Drawing Sheets

U.S. PATENT DOCUMENTS

| | | | |
|---|---|---|---|
| 6,052,815 A | 4/2000 | Zook | |
| 6,101,624 A | 8/2000 | Cheng et al. | |
| 6,119,260 A | 9/2000 | Tomisawa et al. | |
| 6,181,598 B1 | 1/2001 | Matsubara et al. | |
| 6,222,767 B1 | 4/2001 | Kendall et al. | |
| 6,243,291 B1 | 6/2001 | Cheah | |
| 6,253,250 B1 * | 6/2001 | Evans et al. | 709/253 |
| 6,266,273 B1 | 7/2001 | Conley et al. | |
| 6,282,624 B1 | 8/2001 | Kimura et al. | |
| 6,295,619 B1 | 9/2001 | Hasbun et al. | |
| 6,317,371 B2 | 11/2001 | Katayama et al. | |
| 6,330,185 B1 | 12/2001 | Wong et al. | |
| 6,374,337 B1 | 4/2002 | Estakhri | |
| 6,388,920 B2 | 5/2002 | Katayama et al. | |
| 6,421,279 B1 | 7/2002 | Tobita et al. | |
| 6,426,893 B1 | 7/2002 | Conley et al. | |
| 6,449,625 B1 | 9/2002 | Wang | |
| 6,456,528 B1 | 9/2002 | Chen | |
| 6,490,649 B2 | 12/2002 | Sinclair | |
| 6,522,586 B2 | 2/2003 | Wong | |
| 6,525,952 B2 | 2/2003 | Araki et al. | |
| 6,560,143 B2 | 5/2003 | Conley et al. | |
| 6,570,809 B1 | 5/2003 | Lin | |
| 6,581,142 B1 | 6/2003 | Jacobs | |
| 6,996,003 B2 | 2/2006 | Li et al. | |
| 7,039,781 B2 * | 5/2006 | Iwata et al. | 711/165 |
| 7,120,051 B2 | 10/2006 | Gorobets et al. | |
| 7,181,485 B1 | 2/2007 | Lau et al. | |
| 7,266,747 B2 | 9/2007 | Foss | |
| 2002/0124143 A1 | 9/2002 | Barroso et al. | |
| 2003/0065899 A1 | 4/2003 | Gorobets | |
| 2003/0070036 A1 | 4/2003 | Gorobets | |
| 2003/0099134 A1 | 5/2003 | Lasser et al. | |
| 2003/0163629 A1 | 8/2003 | Conley et al. | |
| 2003/1477297 | 8/2003 | Shiota et al. | |
| 2003/0169630 A1 | 9/2003 | Hosono et al. | |
| 2004/0001356 A1 | 1/2004 | Shoichi et al. | |
| 2004/0027857 A1 | 2/2004 | Ooishi | |
| 2006/0156189 A1 | 7/2006 | Tomlin | |

FOREIGN PATENT DOCUMENTS

| | | |
|---|---|---|
| EP | 0 735 491 A | 10/1996 |
| EP | 1008940 | 6/2000 |
| EP | 0615184 | 9/2004 |
| GB | 2034942 | 6/1980 |
| JP | 5282883 | 10/1993 |
| JP | 11003290 | 11/1999 |
| JP | 2001 297447 A | 10/2001 |
| JP | 2002229924 A * | 8/2002 |
| KR | 2001 037452 A | 5/2001 |
| WO | WO 98/44420 | 10/1998 |
| WO | WO 00/49488 | 8/2000 |
| WO | WO 00/67137 | 11/2000 |
| WO | WO 02/49039 A2 | 6/2002 |
| WO | WO 02/058074 A2 | 7/2002 |
| WO | WO 03/029951 A2 | 4/2003 |
| WO | WO 03/069627 A1 | 8/2003 |

OTHER PUBLICATIONS

Notification of Transmittal of the International Search Report and the Written Opinion of the International Searching Authority, or the Declaration for International Application No. PCT/US2005/045695 mailed May 8, 2006, 10 pages.

Listing of Pending Claims for International Application No. PCT/US2005/045695, 4 pages.

Nakamura et al., "A Novel Sense Amplifier for Flexible Voltage Operation NAND Flash Memories," 1995 *Symposium on VLSI Circuits Digest of Technical Papers*, Jun. 8-10, 1995, pp. 71-72.

Srisa-an et al., "Performance Enhancements to the Active Memory System," *2002 IEEE International Conference on Computer Design: VLSI in Computers and Processors*, Sep. 16-18, 2002, pp. 249-256.

Lee et al., "High-Performance 1-Gb NAND Flash Memory with 0.12-μm Technology," *Journal of Solid-State Circuits*, Nov. 2002, vol. 37, No. 11, pp. 1502-1509.

Imamiya et al., "A 125-mm$^2$ 1-Gb NAND Flash Memory with 10/Mbyte/s Program Speed," *IEEE Journal of Solid State Circuits*, vol. 37, No. 11, Nov. 2002, pp. 1493-1501.

* cited by examiner

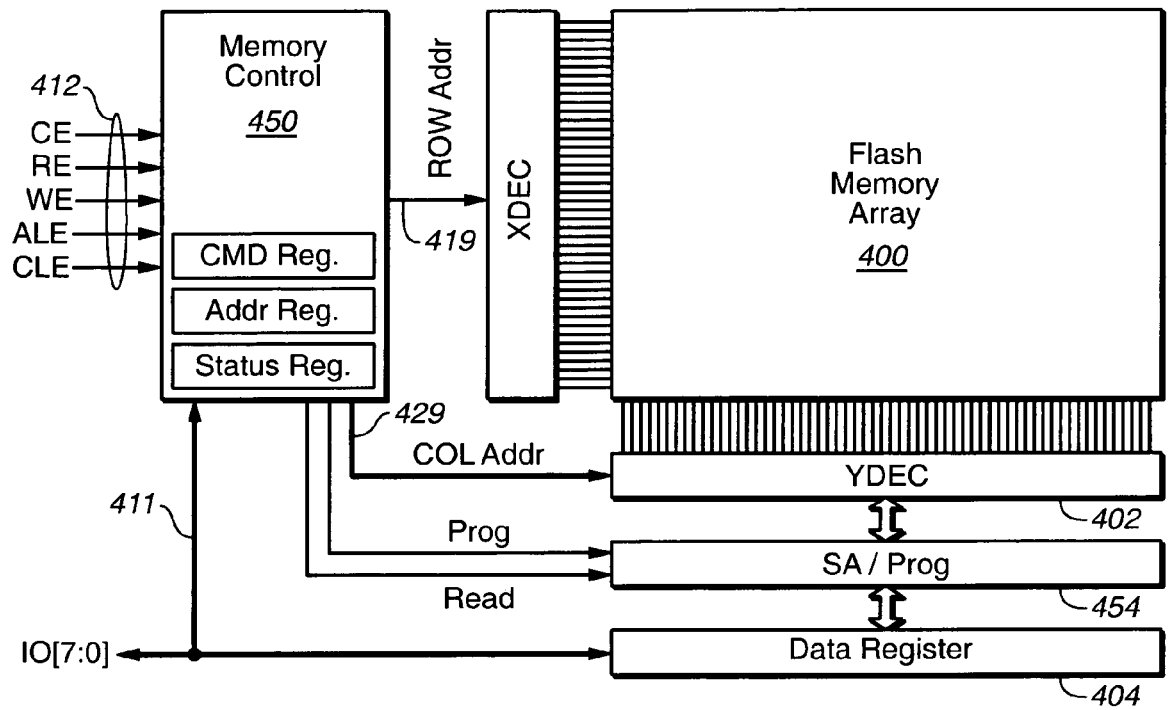
FIG._1
*(PRIOR ART)*
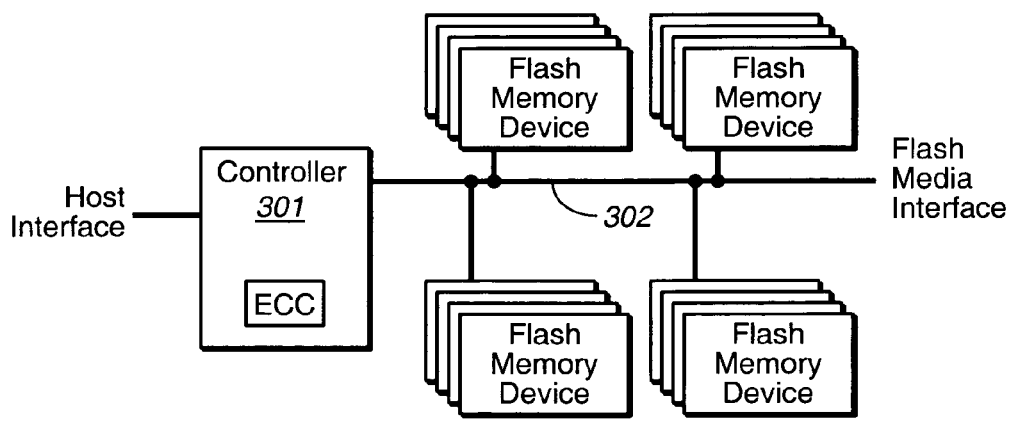
FIG._2
*(PRIOR ART)*

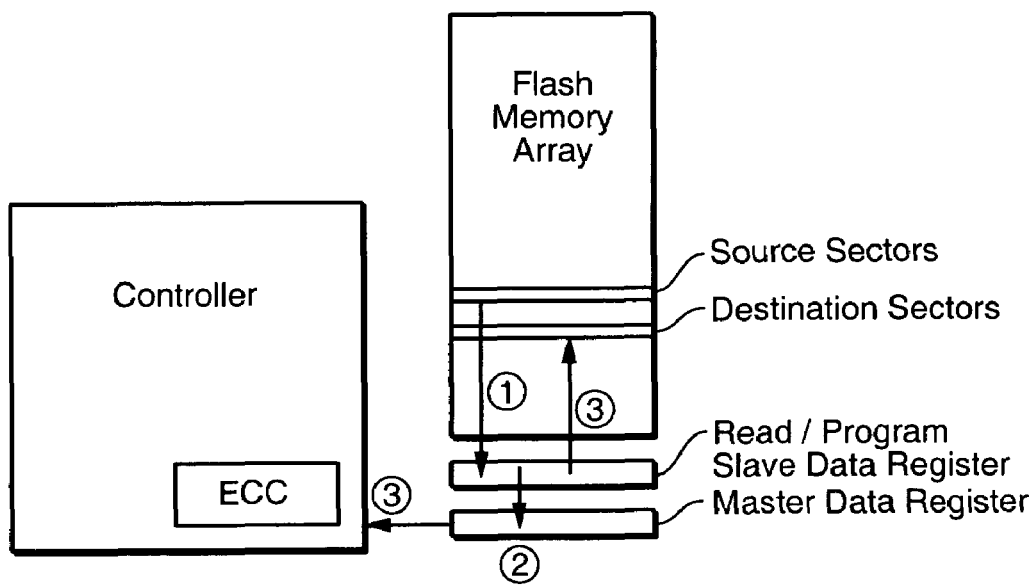
FIG._3
*(PRIOR ART)*
Flash - Controller Connections
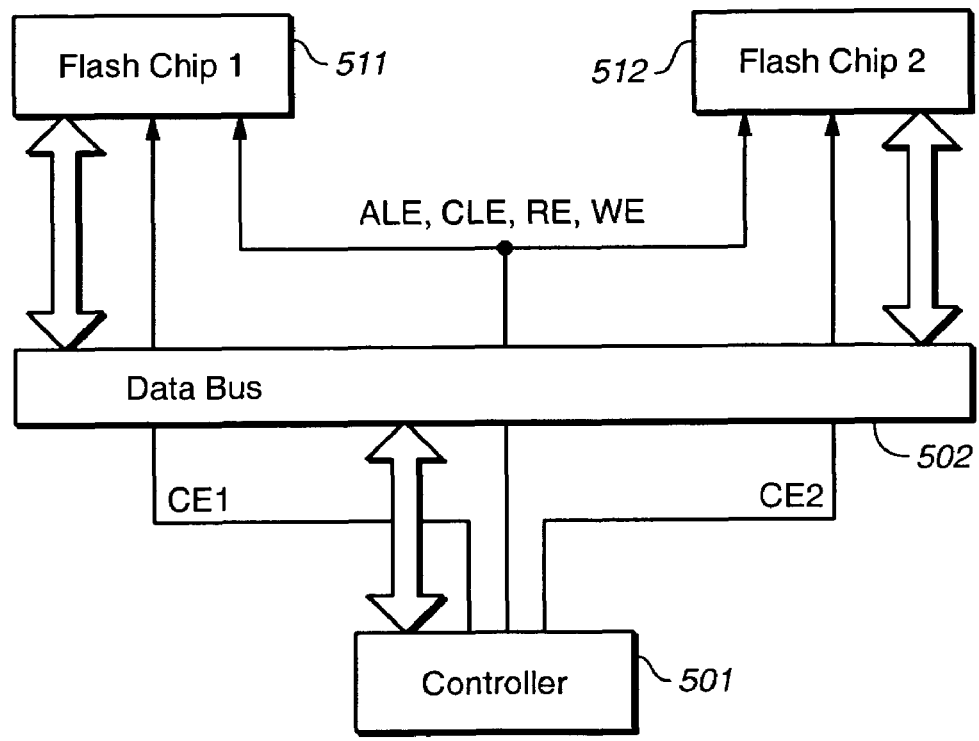
FIG._4

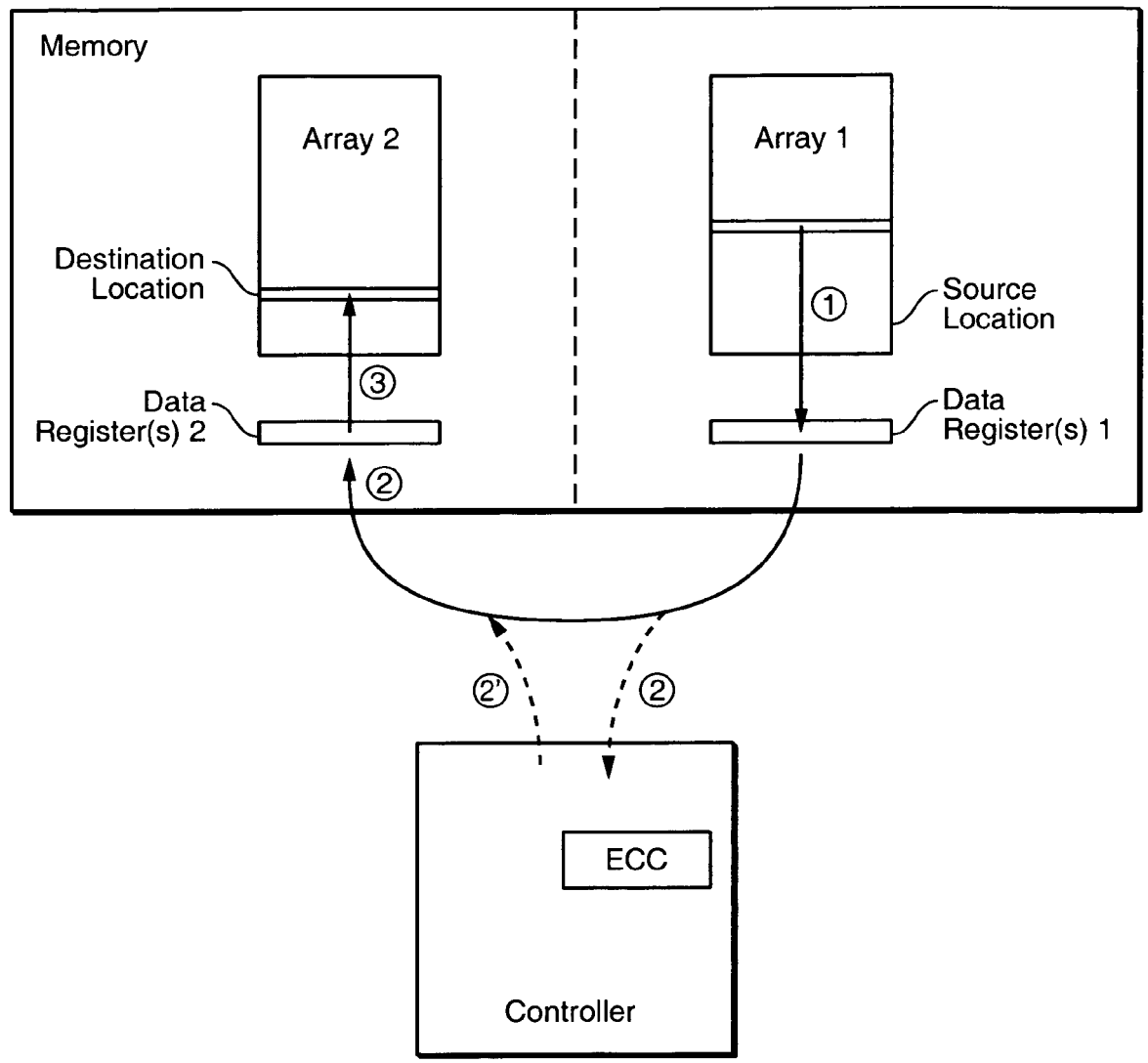
FIG._5

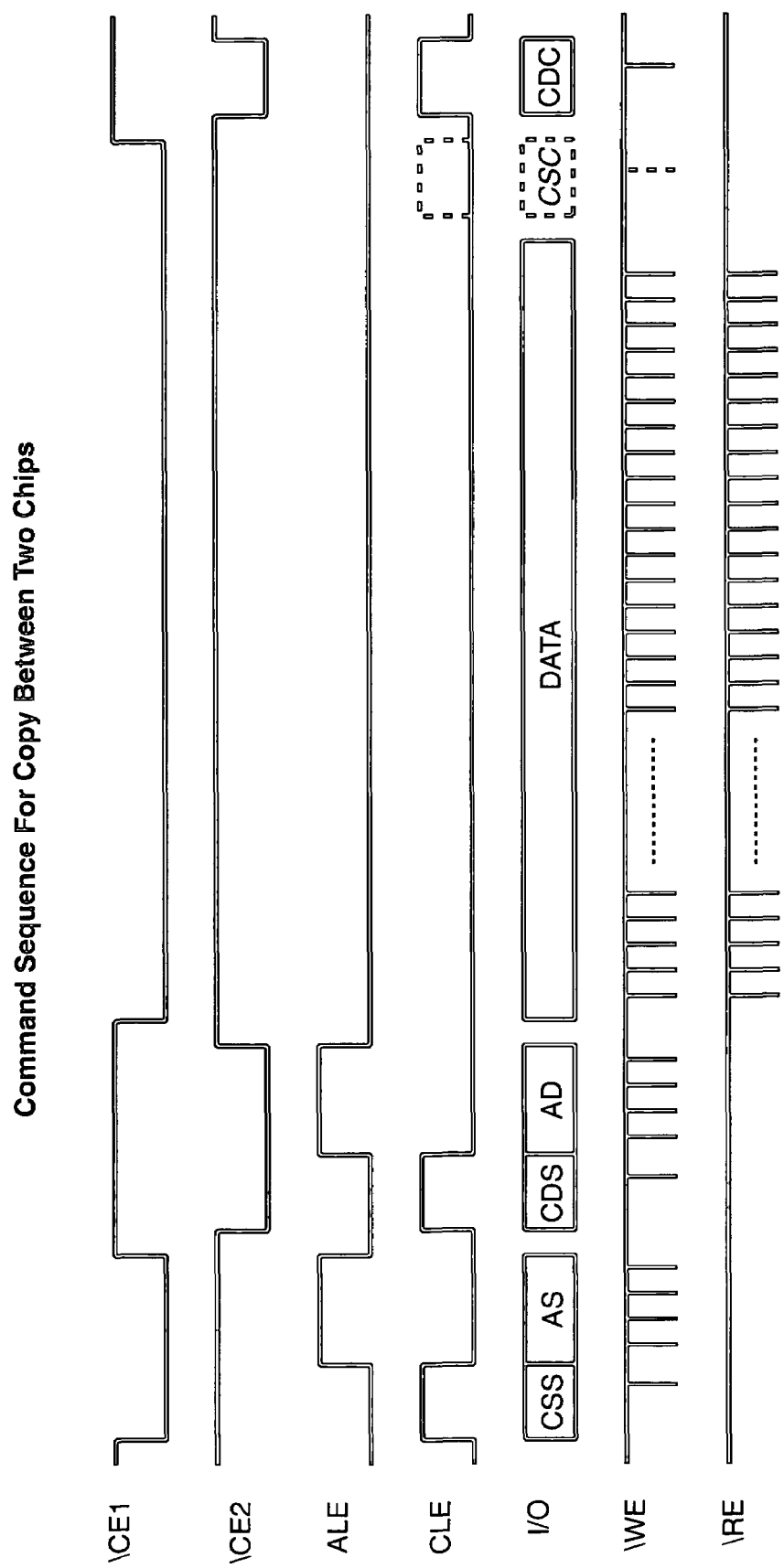
FIG._6

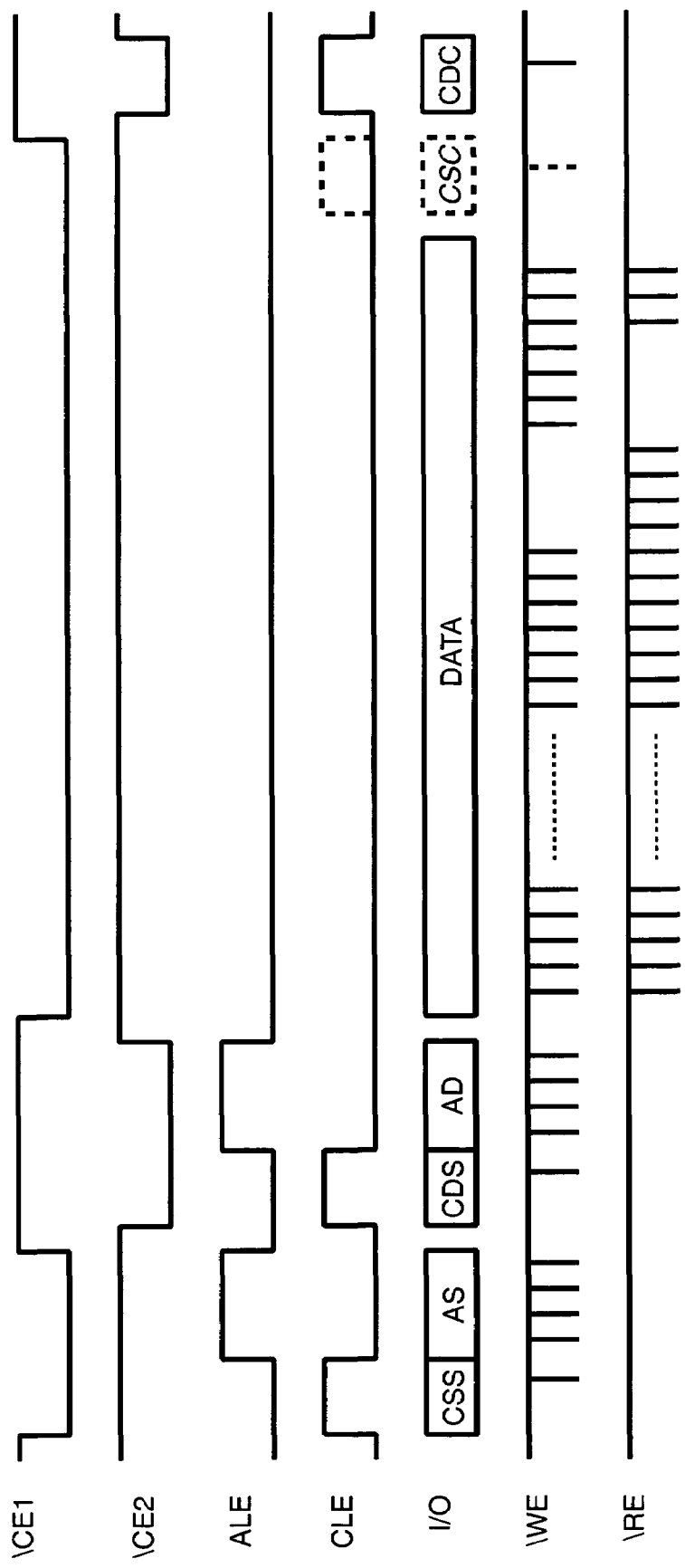
FIG._7

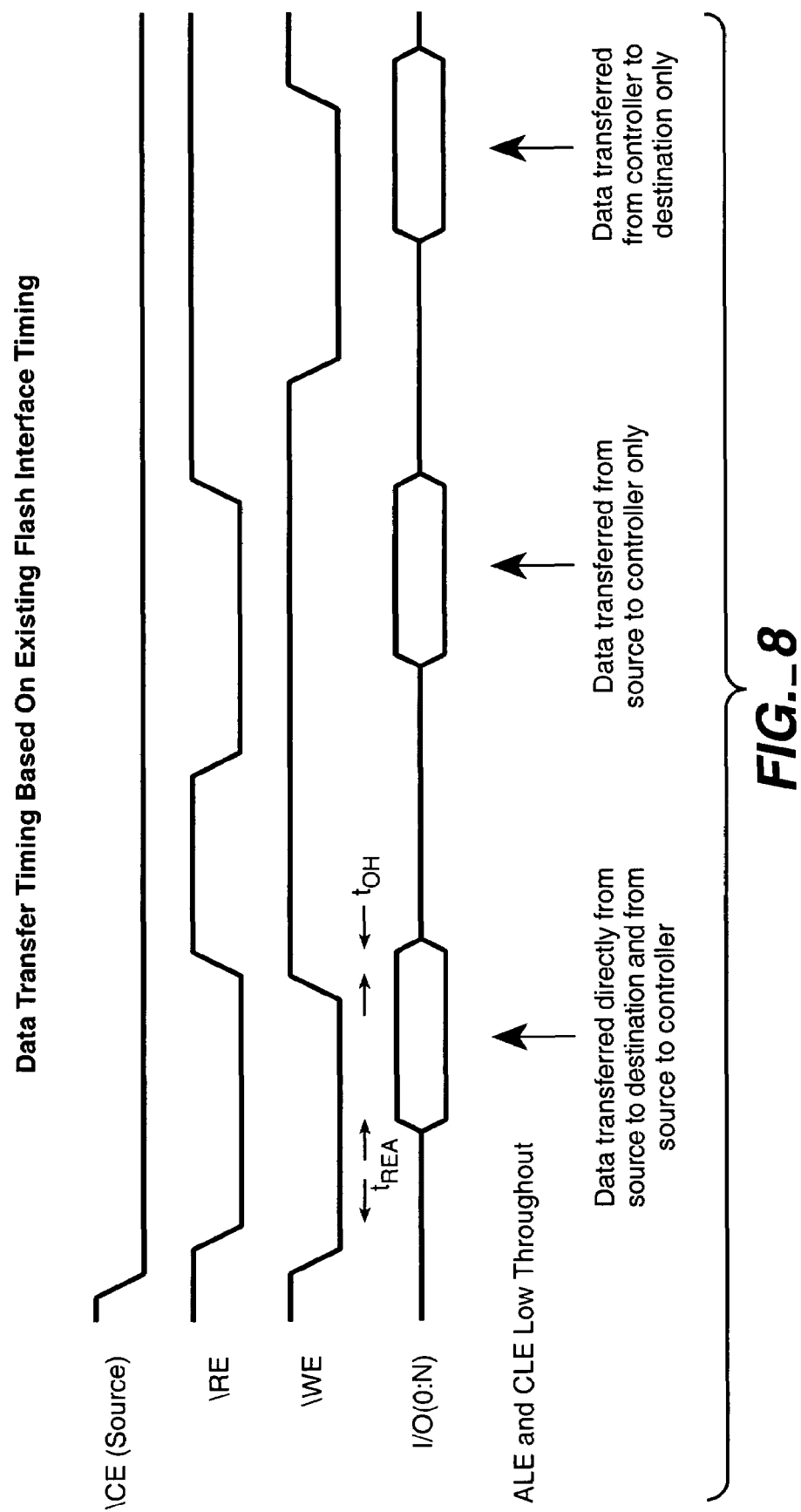
FIG._8

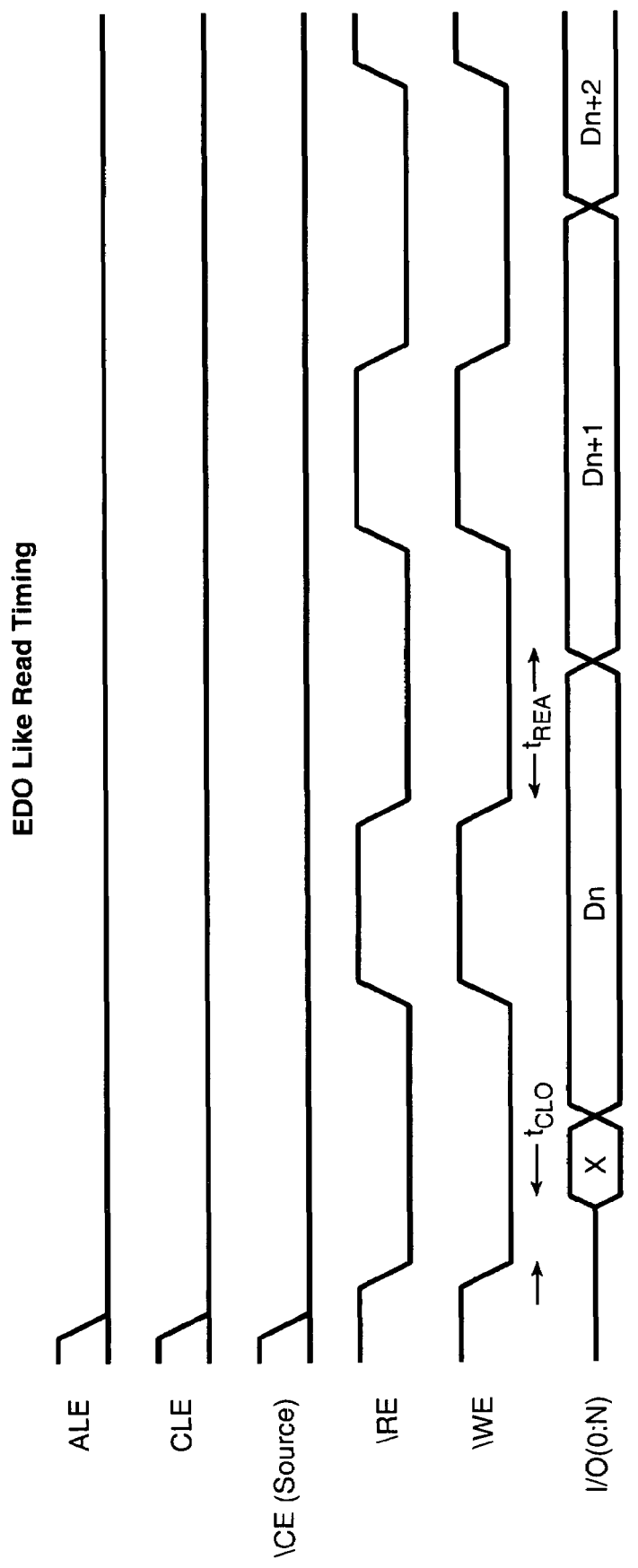
FIG._9

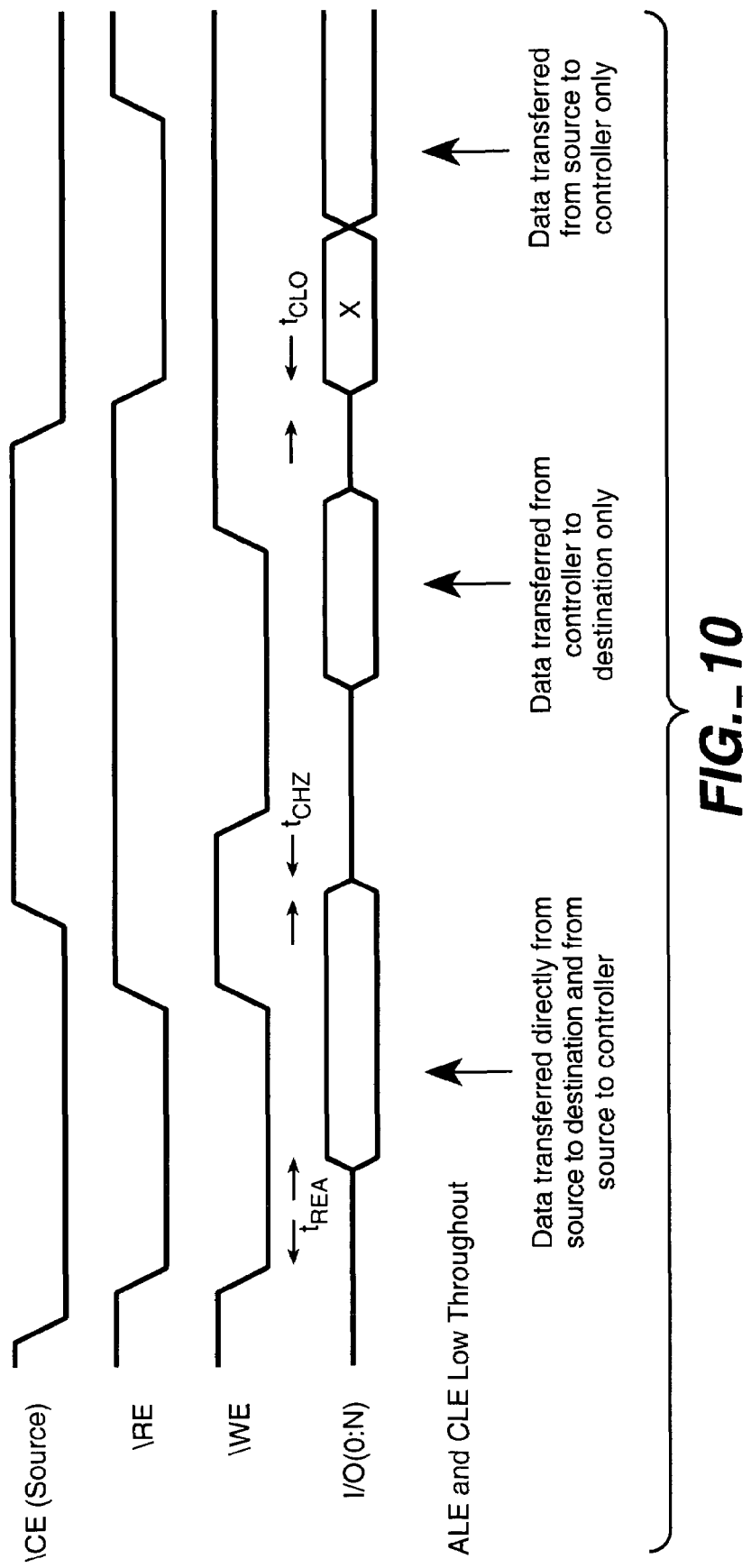
FIG._10

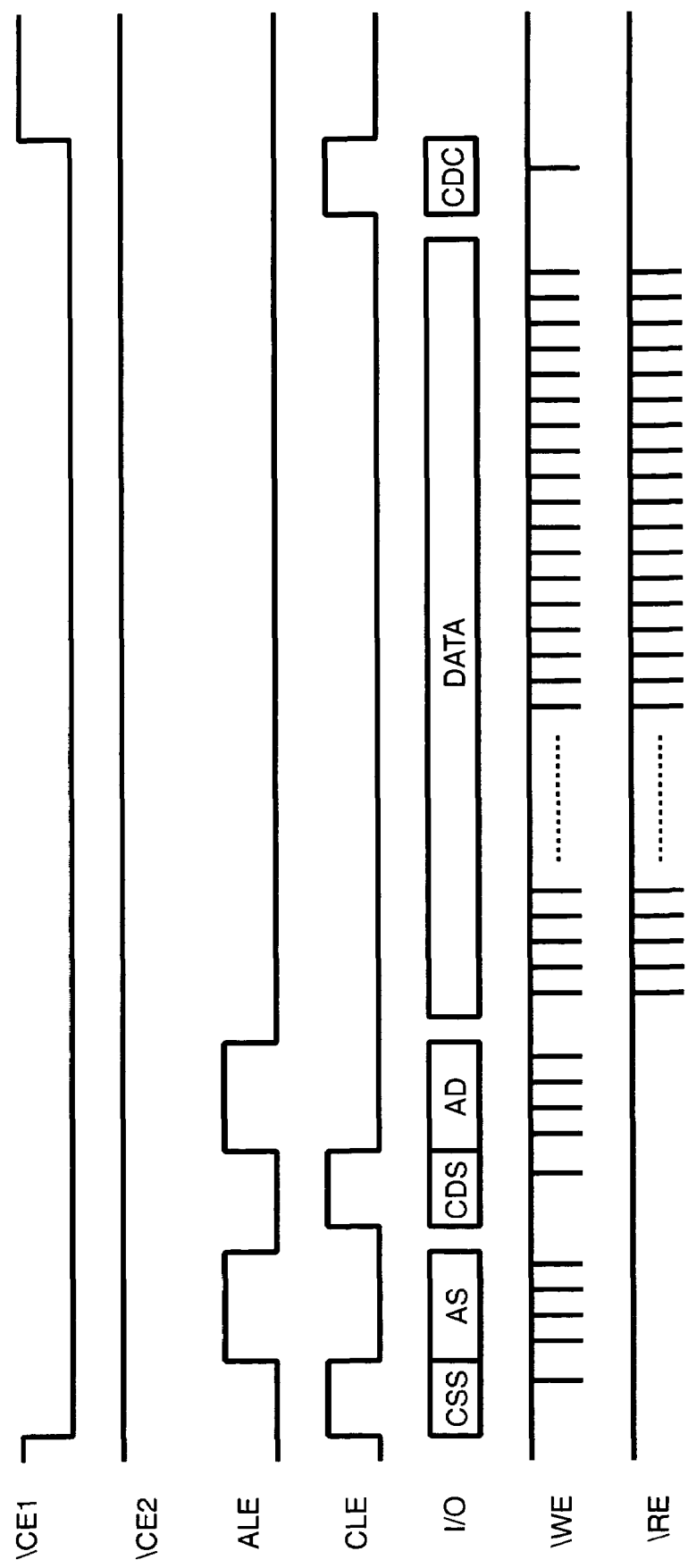
FIG._11

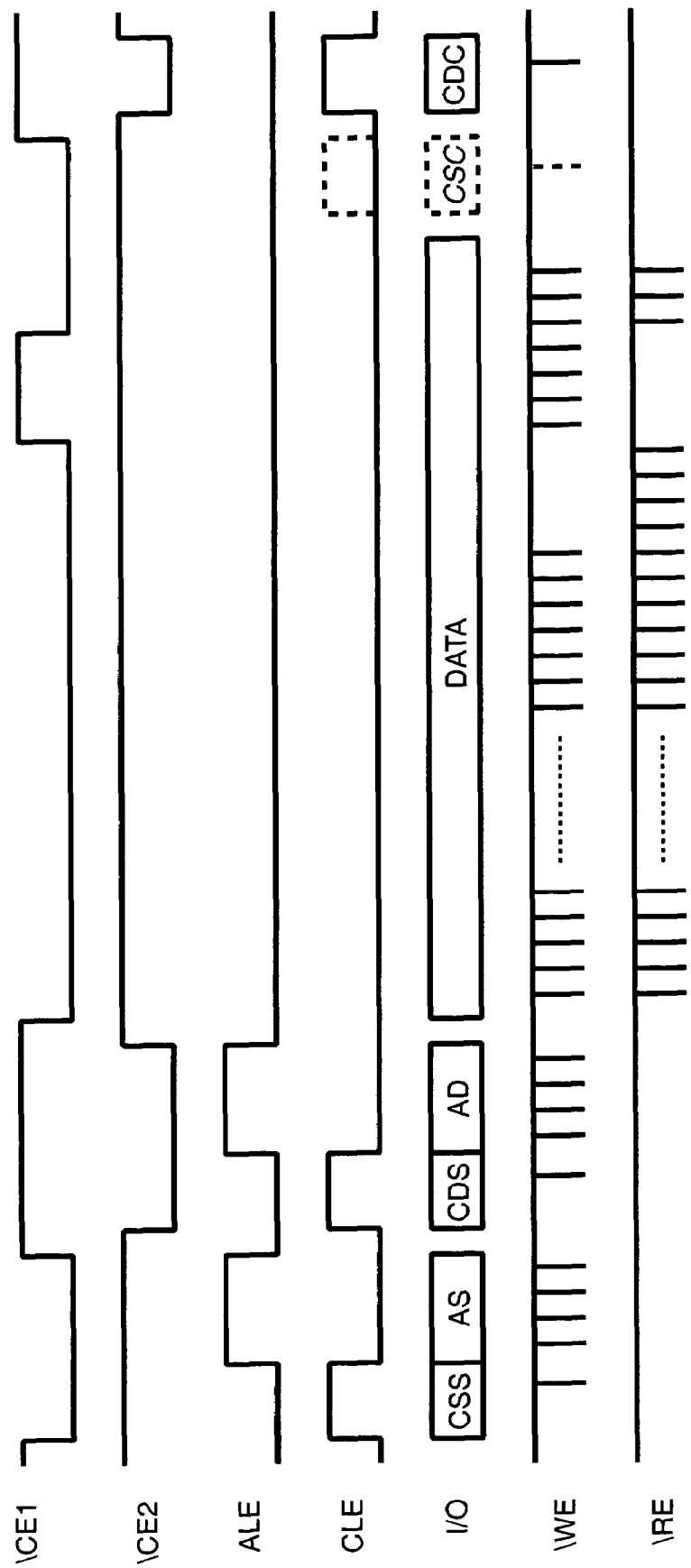
FIG._12

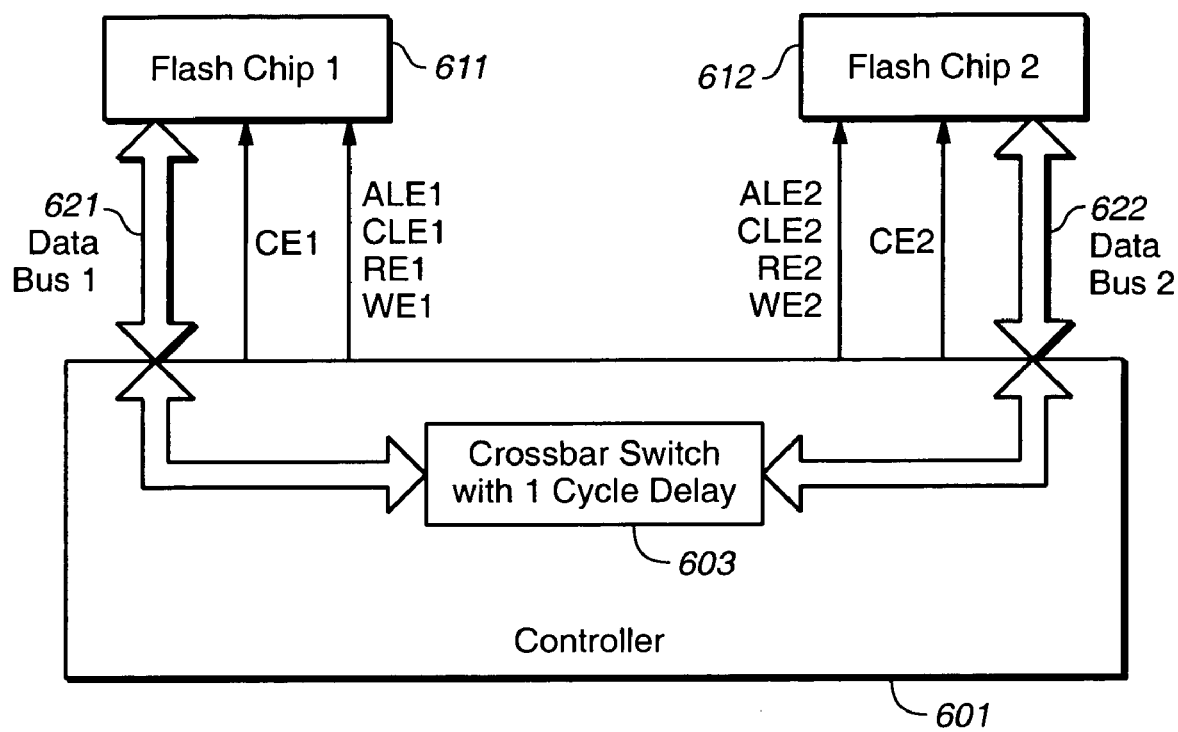
FIG._13

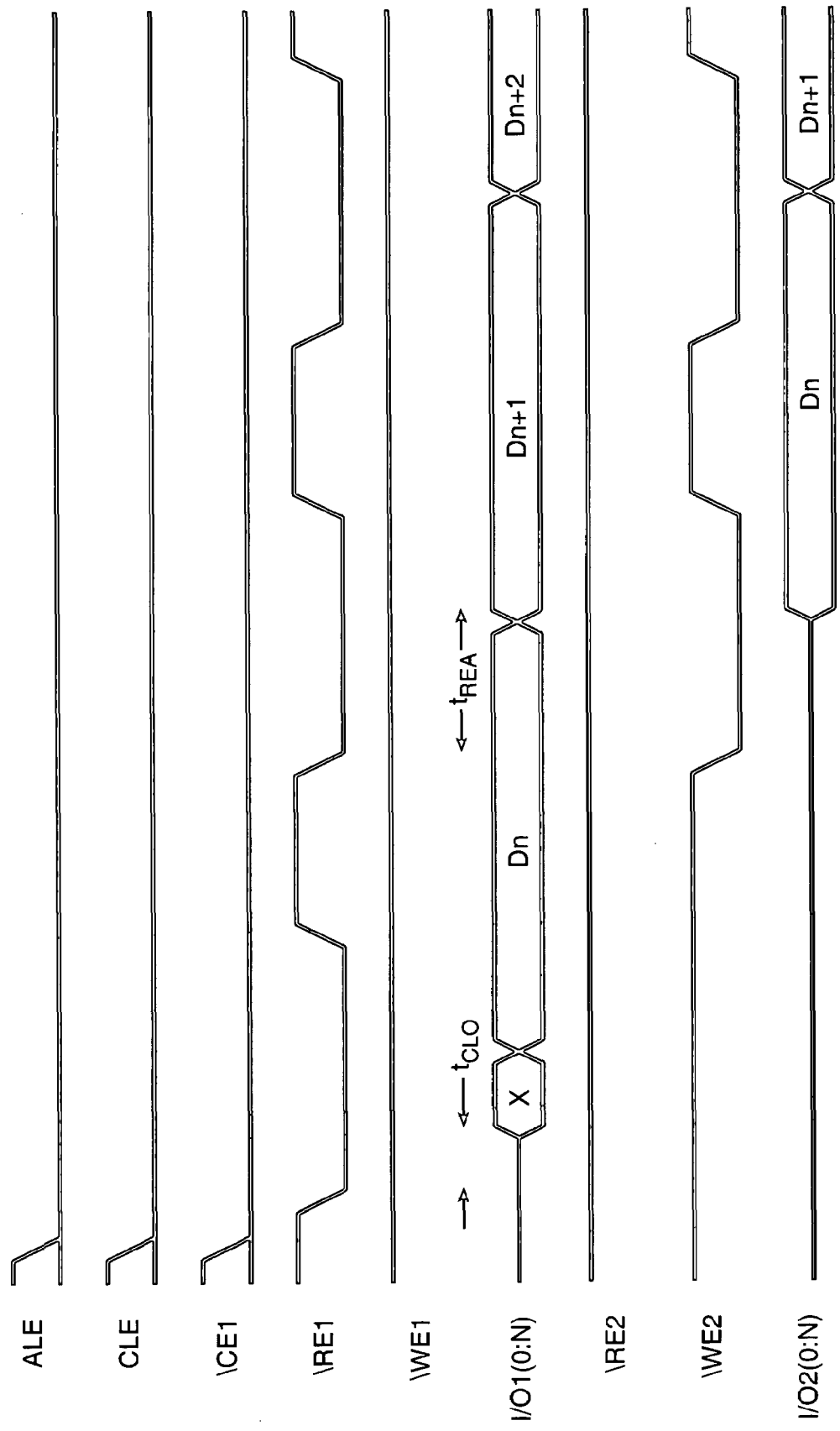
FIG._14

OFF-CHIP DATA RELOCATION

BACKGROUND OF THE INVENTION

This invention pertains to the field of semiconductor non-volatile data storage system architectures and their methods of operation, and has application to data storage systems based on flash electrically erasable and programmable read-only memories (EEPROMs) and other types of memory system.

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data; although the size of a write page need not be the same as the size of a read page, in the following they are treated as being the same in order to simplify the discussion. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses (LBAs) received by the memory sub-system from a host, and physical block numbers (PBNs) and page addresses within the memory cell array. This translation often involves use of intermediate terms for a logical block number (LBN) and logical page. The controller also manages the low level flash circuit operation through a series of commands that it issues to the flash memory devices via an interface bus. Another function the controller performs is to maintain the integrity of data stored to the subsystem through various means, such as by using an error correction code (ECC).

FIG. 1 shows a typical internal architecture for a flash memory device 131. The primary features include an input/output (I/O) bus 411 and control signals 412 to interface to an external controller, a memory control circuit 450 to control internal memory operations with registers for command, address and status signals. One or more arrays 400 of flash EEPROM cells are included, each array having its own row decoder (XDEC) 401 and column decoder (YDEC) 402, a group of sense amplifiers and program control circuitry (SA/PROG) 454 and a data register 404. Presently, the memory cells usually include one or more conductive floating gates as storage elements but other long-term electron charge storage elements may be used instead. The memory cell array may be operated with two levels of charge defined for each storage element to therefore store one bit of data with each element. Alternatively, more than two storage states may be defined for each storage element, in which case more than one bit of data is stored in each element.

If desired, a plurality of arrays 400, together with related X decoders, Y decoders, program/verified circuitry, data registers, and the like are provided, for example as taught by U.S. Pat. No. 5,890,192, issued Mar. 30, 1999, and assigned to SanDisk Corporation, the assignee of this application, which is hereby incorporated by this reference. Related memory system features are described in U.S. Pat. No. 6,426,893, issued Jul. 30, 2002, and assigned to SanDisk Corporation, the assignee of this application, which application is also expressly incorporated herein by this reference. These patents describe having multiple semi-autonomous arrays, referred to as planes or "quads" on a single memory chip.

The external interface I/O bus 411 and control signals 412 can include the following:

| | |
|---|---|
| CE—Chip Enable. | Used to activate flash memory interface. |
| RE—Read Enable. | Used to indicate the I/O bus is being used to transfer data from the memory array. |
| WE—Write Enable. | Used to indicate the I/O bus is being used to transfer data to the memory array. |
| ALE—Address Latch Enable | Indicates that the I/O bus is being used to transfer address information. |
| CLE—Command Latch Enable. | Indicates that the I/O bus is being used to transfer command information. |
| IO[7:0] - Address/Data Bus | This I/O bus is used to transfer data between controller and the flash memory command, address and data registers of the memory control 450. |

In addition to these signals, it is also typical that the memory have a means by which the storage subsystem controller may determine that the memory is busy performing some task. Such means could include a dedicated signal or a status bit in an internal memory register that is accessible while the memory is busy.

This interface is given only as an example as other signal configurations can be used to give the same functionality. FIG. 1 shows only one flash memory array 400 with its related components, but a multiplicity of such arrays can exist on a single flash memory chip that share a common interface and memory control circuitry but have separate XDEC 401, YDEC 402, SA/PROG 454 and DATA REG 404 circuitry in order to allow parallel read and program operations. More generally, there may be one or two additional such data registers typically arranged into the sort of master slave arrangements developed further in U.S. Pat. No. 6,560,143, which is hereby incorporated by reference.

Data is transferred from the memory array through the data register 404 to an external controller via the data registers' coupling to the I/O bus IO[7:0] 411. The data register 404 is also coupled the sense amplifier/programming circuit 454. The number of elements of the data register coupled to each sense amplifier/programming circuit element may depend on the number of bits stored in each storage element of the memory cells, flash EEPROM cells each containing one or more floating gates as the storage elements. Each storage element may store a plurality of bits, such as 2 or 4, if the memory cells are operated in a multi-state mode. Alternatively, the memory cells may be operated in a binary mode to store one bit of data per storage element.

The row decoder 401 decodes row addresses for the array 400 in order to select the physical page to be accessed. The row decoder 401 receives row addresses via internal row address lines 419 from the memory control logic 450. A column decoder 402 receives column addresses via internal column address lines 429 from the memory control logic 450.

FIG. 2 shows an architecture of a typical non-volatile data storage system, in this case employing flash memory cells as the storage media. In one form, this system is encapsulated within a removable card having an electrical connector extending along one side to provide the host interface when inserted into a receptacle of a host. Alternatively, the system of FIG. 2 may be embedded into a host system in the form of a permanently installed embedded circuit or otherwise. The system utilizes a single controller 301 that performs high-level host and memory control functions. The flash memory media is composed of one or more flash memory devices, each such device often formed on its own integrated circuit chip. The system controller and the flash memory are connected by a bus 302 that allows the controller 301 to load command, address, and transfer data to and from the flash memory array. (The bus 302 includes 412 and 411 of FIG. 1.) The controller 301 interfaces with a host system (not shown) with which user data is transferred to and from the flash memory array. In the case where the system of FIG. 2 is included in a card, the host interface includes a mating plug and socket assembly (not shown) on the card and host equipment.

The controller 301 receives a command from the host to read or write one or more sectors of user data starting at a particular logical address. This address may or may not align with the first physical page in a block of memory cells.

In some prior art systems having large capacity memory cell blocks that are divided into multiple pages, the data from a block that is not being updated needs to be copied from the original block to a new block that also contains the new, updated data being written by the host. In other prior art systems, flags are recorded with the user data in pages and are used to indicate that pages of data in the original block that are being superceded by the newly written data are invalid. A mechanism by which data that partially supercedes data stored in an existing block can be written without either copying unchanged data from the existing block or programming flags to pages that have been previously programmed is described in U.S. Pat. No. 6,763,424, which application is expressly incorporated herein by this reference.

Non-volatile memory systems of this type are being applied to a number of applications, particularly when packaged in an enclosed card that is removable connected with a host system. Current commercial memory card formats include that of the Personal Computer Memory Card International Association (PCMCIA), CompactFlash (CF), MultiMediaCard (MMC) and Secure Digital (SD). Other systems include USB devices, such as memory cards including cards with two sets of contacts, such as those described in U.S. patent application Ser. No. 10/826,801 and U.S. Ser. No. 10/826,796, both filed Apr. 16, 2004, and hereby incorporated by reference. One supplier of these cards is SanDisk Corporation, assignee of this application. Host systems with which such cards are used include personal computers, notebook computers, hand held computing devices, cameras, audio reproducing devices, and the like. Flash EEPROM systems are also utilized as bulk mass storage embedded in host systems.

Such non-volatile memory systems include one or more arrays of floating-gate memory cells and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than the capacity of the memory block, often being equal to the standard disk drive sector size, 512 bytes. In one commercial architecture, the memory system block is sized to store one sector of user data plus overhead data, the overhead data including information such as an error correction code (ECC) for the user data stored in the block, a history of use of the block, defects and other physical information of the memory cell block. Various implementations of this type of non-volatile memory system are described in the following United States patents and pending applications assigned to SanDisk Corporation, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859 and 5,712,180, and application Ser. No. 08/910,947, filed Aug. 7, 1997, and Ser. No. 09/343,328, filed Jun. 30, 1999. Another type of non-volatile memory system utilizes a larger memory cell block size that stores multiple sectors of user data.

One architecture of the memory cell array conveniently forms a block from one or two rows of memory cells that are within a sub-array or other unit of cells and which share a common erase gate. U.S. Pat. Nos. 5,677,872 and 5,712,179 of SanDisk Corporation, which are incorporated herein in their entirety, give examples of this architecture. Although it is currently most common to store one bit of data in each floating gate cell by defining only two programmed threshold levels, the trend is to store more than one bit of data in each cell by establishing more than two floating-gate transistor threshold ranges. A memory system that stores two bits of data per floating gate (four threshold level ranges or states) is currently available, with three bits per cell (eight threshold level ranges or states) and four bits per cell (sixteen threshold level ranges) being contemplated for future systems. Of course, the number of memory cells required to store a sector of data goes down as the number of bits stored in each cell goes up. This trend, combined with a scaling of the array resulting from improvements in cell structure and general semiconductor processing, makes it practical to form a memory cell block in a segmented portion of a row of cells. The block structure can also be formed to enable selection of operation of each of the memory cells in two states (one data bit per cell) or in some multiple such as four states (two data bits per cell), as described in SanDisk Corporation U.S. Pat. No. 5,930,167, which is incorporated herein in its entirety by this reference.

In addition to increasing the capacity of such non-volatile memories, there is a search to also improve such memories by increasing their performance and decreasing their susceptibility to error. Memories such as those described above that utilize large block management techniques perform a number of data management techniques on the memory's file system, including garbage collection, in order to use the memory area more effectively. Such garbage collection schemes involve a data relocation process including reading data from one (or more) locations in the memory and re-writing it into another memory location. (In addition to many of the above incorporated references, garbage collection is discussed further in, for example, "A 125-mm$^2$ 1-Gb NAND Flash Memory With 10-MByte/s Program Speed", by K. Imamiya, et al., IEEE Journal of Solid-State Circuits, Vol. 37, No. 11, November 2002, pp. 1493-1501, which is hereby incorporated in its entirety by this reference.) This data relocation time is a main contributor to all garbage collection routines. Prior art methods describe the data relocation operation as a consecutive data read, then data integrity check and error correction, if necessary, before writing the data to a new location, so that there is a high constant performance penalty of data transfer and verification. In the case of data error, additional time must be spent to correct the data before write.

Other prior art methods exploit an on-chip copy feature, writing the data from one location to another without a precheck of the data integrity. Such a method is described, for example, in "High Performance 1-Gb NAND Flash Memory With 0.12 μm Technology", by J. Lee, et al., IEEE Journal of Solid-State Circuits, Vol. 37, No. 11, November 2002, pp. 1502-1509, which is hereby incorporated in its entirety by this reference. The integrity check is done concurrently with the data write so that, in the case of error, there is a high probability of the need to rewrite the entire block with a high penalty in performance and time-out/latency.

A particular on-chip copy mechanism, shown in FIG. 3, and is presented in more detail in U.S. Pat. No. 6,266,273, which is hereby incorporated by reference. As indicated by step (1) in FIG. 3, a data set, such as a page, is read from a source location to a read/program slave data register. The architecture shown in FIG. 3 uses a master-slave arrangement for its data registers and the read copy of the data set is transferred in step (2) to the master register. In step (3), the copied data set is then relocated to the destination location in parallel with transferring it from the master data register to the controller. This technique allows for on-chip relocation while also transferring a copy of the data to the controller where it can be checked.

According to the prior art, when, from time to time, flash memory media management algorithms need to copy data from one location to another in the flash memory array, there are two basic methods used to achieve this. The first method is to read data from the array to a buffer, transfer the data to the controller and then transfer back from the controller to the new location in flash before programming. The second method is to read the data from the array to the buffer and then program directly back into a new array location. The second method is referred to as on-chip copy.

The second method gives a shorter copy time because there is no transfer from controller to flash. With high levels of read and programming parallelism, the differences can be significant. However, the performance comes at a penalty of flexibility. On-chip copy mechanisms currently restrict operation to copying within a plane, so that it is not possible to transfer data between two different chips or between two planes on the same chip. This means that either data must be organized such that it will always be copied between two locations in the same plane of the same chip or separate reads and writes must be used. The latter approach results in performance that varies according to the location of the source and target for the data. A potentially large amount of buffering is required in the controller to allow parallel operation in the flash chips.

Consequently, the operation of such memory systems could be greatly improved if data relocation operations could be extended to allow relocations between different planes or chips without the need to buffer the data in the controller. This is particularly true for memory systems relying upon large block data structures, where such garbage collection operations place large demands on the management of the memory.

SUMMARY OF THE INVENTION

According to one principal aspect of the present invention, briefly and generally, the on-chip copy process is extended so that the data may be copied between two blocks that may be on different chips, different planes on the same chip, or the same plane of the same chip. More specifically, the methods described here provide a single data copying mechanism that allows data to be copied between any two locations in a memory system. The performance for the copy is the same as for traditional on-chip copy as it is commonly implemented. By removing the restrictions on data location, improvements in algorithm operation can be made that reduce the frequency of copying data.

More specifically, the present invention extends on-chip copy to chip-to-chip copies and between arrays on the same chip without having to temporarily store the relocated data set in the controller. The described methods can be used for copying between arrays on a common data bus as well in topologies where arrays are connected to the systems controller through distinct data busses. In a particular multi-bus embodiment, the relocated data set is transferred in the controller a word at time between the bus of the source array and the bus of the destination array. A unified set of commands is presented to cover all of the described cases. An exemplary embodiment uses an EDO-type timing.

According to another aspect of the present invention, selected portions of the relocated data, such as chosen words in a transferred page, can be updated in the controller on the fly. For example, this can be used to update the header portion of a page as part of the relocation process. In addition to transferring a data set directly from a read buffer of a source array to a write buffer of a destination array, the data set can concurrently be copied, if desired, into the controller where an error detection and correction operation can be performed on it.

In an exemplary embodiment, data of a relocated data page is placed on the data bus from the source buffer a word at a time, from where it is read off by the destination buffer during the same cycle. The process begins with the controller issuing a command and source address to a selected array and a command and destination address to a selected destination array, which can be the same array, a different plane on the same chip, or on a different chip. In the multi-chip case, the command sequence results in having multiple chips active on the same bus at the same time. The controller then toggles the read enable and write enable signals as the page to be relocated is transferred a word at a time. Upon completion, the controller disables the destination and source as needed.

Additional aspects, features and advantages of the present invention are included in the following description of exemplary embodiments, which description should be read in conjunction with the accompanying drawings.

BRIEF DESCRIPTION OF THE DRAWINGS

FIG. 1 is a block diagram of a typical prior art flash EEPROM memory array with memory control logic, data and address registers.

FIG. 2 illustrates an architecture utilizing memories of FIG. 1 with a system controller.

FIG. 3 shows an example of an on chip-copy sequence in the prior art.

FIG. 4 shows the memory-controller connections of an exemplary embodiment.

FIG. 5 is a schematic representation of a generalized off-chip copy sequence.

FIG. 6 is a command sequence for copy between two chips according to one embodiment.

FIG. 7 shows an example of chip-to-chip copy with data modification using typical flash interface timing.

FIG. 8 shows an example of data transfer timing based on typical flash interface timing.

FIG. 9 shows an example of data transfer timing based on EDO-like read timing.

FIG. 10 shows an example of data modification with EDO-like read timing.

FIG. 11 shows copying between two locations on the same chip.

FIG. 12 shows an example of data modification with EDO-like read timing.

FIG. 13 shows the memory-controller connections of an example of a multiple bus system.

FIG. 14 is an example of multi-bus copy using EDO-like read timing.

DESCRIPTION OF EXEMPLARY EMBODIMENTS OF THE INVENTION

In a first aspect, the present invention generalizes the copy operation to allow data to be copied between two memory blocks that may be on two different chips, on two planes on the same chip, or as well as on the same plane of the same chip. Consequently, the methods described here provide a single data copying mechanism that allows data to be copied between any two locations in a flash or other memory array. The performance for the more general copy is the same as for on-chip copy as it is generally applied in the prior art. Removing the restrictions on data location, result in improved algorithm operations that reduce the frequency of copying data.

Generally, the method described here allows data in memory block to be copied to another memory block that may be:

1) In a different chip;
2) In a different plane of the same chip; or
3) In the same plane of the same chip.

To support this functionality, the control logic and data paths within the flash chips are modified relative to that in the prior art. The concept is described in the context of existing flash chip pins, but system integration could be facilitated by implementing a modified interface. However, such changes to the interface would remove compatibility with existing systems, which may or may not be desirable. For copy to a different chip, the first portion of the following description will only consider the copying of data between two chips on same bus. A scheme to allow copy between two chips on separate buses, which is a function of the controller design or system architecture and not that of the memory chip, is considered in the later portions of the descriptions.

The process is first described for an off-chip copy between different chips. FIG. 4 shows a schematic representation of a small memory system. The controller 501 is connected to the first memory (here flash) chip 511 and the second memory (here flash) chip 512 through data bus 502. The shared control signals (Address Latch Enable (ALE), Command Latch Enable (CLE), Read Enable (RE), Write Enable (WE)) and the chip enable signals (CE1, CE2) also have the paths explicitly shown. There may be only one or there may be more than two flash chips in a real system, but for explanatory purposes the process is initially described for two distinct chips.

Two examples are given below that illustrate the general flow of commands for a somewhat simplified implementation; the detailed operation of a real device might differ from the examples. These examples are followed by a more detailed look at the interface timing.

As a first example, consider the operation of copying a sector from chip 1 to chip 2. This is shown in FIG. 6 and has the following phases:

1. The controller sends commands to chip 1 to read data from a first location in the source array to buffers; in some embodiments, these may be special buffers for off-chip copy.
2. The controller sends commands and address bytes to chip 1 to configure the chip as an off chip copy source. This is implemented by enabling chip 1 (\CE1 going low), taking the command latch enable (CLE) high, placing the copy source start (CSS) command on the I/O line, and toggling write enable. For the address, the address latch enable (ALE) is taken high and the source address (AS) placed on the I/O line while toggling the write enable. The address bytes determine the source plane for the data.
3. The controller sends commands and address bytes to chip 2 to configure the chip as an off-chip copy destination in a similar manner, but now enabling chip 2 (\CE2 low). The address bytes determine the target address (e.g. plane, block, page, and column) for the data.
4. The controller toggles RE (read enable) and WE (write enable) in a synchronized manner to transfer the data set a byte (corresponding to the bus width in this example) at a time from chip 1 to chip 2. It may also simultaneously transfer the data from chip 1 buffer to the controller. As an off chip copy destination, chip 2 responds to WE without CE2 (chip 2 enable) being asserted but ignores RE. (If the data is also transferred to the controller, the controller may modify data during the copy, as discussed below. This is achieved by driving pulses on RE (with WE high) to read data from chip 1 without copying to chip 2. The data is modified in the controller and then transferred to chip 2 by driving pulses on WE (with RE high) and driving the data bus from the controller. These operations are shown in the timing diagrams discussed below.)
5. Once the transfer is complete, the controller sends a command (CSC and CDC) to each chip to terminate off chip copy. It is possible that the CSC command is not required for chip 1. In the case of chip 2, this command identifies the programming operation. The range of commands preferably can support a copy abort option that would be used in the event of an ECC failure in the read data.

Under this arrangement, chip 2 is specified as the destination and receives the destination address, resulting in the destination chip as well as the source chip being enabled at the same time; that is, there will concurrently be multiple devices active on the bus. The chip enable signal for chip 2 is not asserted (\CE2 is high) during the actual transfer of data: only the source chip has its enable signal explicitly asserted. The data being transferred is placed on the bus and, as WE is driven high, the destination chip takes in the data on the bus. The enable signal for the destination chip is only re-asserted to receive the CDC command indicating the end of the transfer. FIG. 6 and its variations, such as when part of the data set is modified as part of the transfer, are discussed further below.

In this discussion of copying a sector from one chip to another chip, as well in the following discussion where the source and destination locations are both in the same chip, the implicit assumption is that the destination location is not busy with other operations. Depending on device design, however, these techniques can readily extend to the case where the destination may be may be busy programming data from a previous operation. There exist a number of devices that allow, during non-copy operations, the transfer of data for a following program operation prior to completing a current programming operation. This sort of operation pipelining is known as "cached write" and can be combined with the data relocation techniques of the present invention. For example, in a memory design providing such a mechanism, data relocation using cached copying can be achieved within a single chip by allowing a read to interrupt a program. More detail on such overlapped operations are described in U.S. patent application Ser. No. 10/081,375 filed Feb. 22, 2002, and Ser. No. 10/846,289 filed May 13, 2004, and U.S. Pat. No. 6,134,145, all of which are hereby incorporated by reference.

In a second example, the source and destination locations are both in chip 1. This is shown in FIG. 11. To support this function, some embodiments may introduce extra buffering in the memory chip. Depending on the buffering and logic in the chip, this method allows data from one block to be transferred to any other block in the chip. From an external perspective, copying back to the same chip is identical to copying between chips. As can be seen from a comparison between FIGS. 6 and 11, FIG. 11 differs in that chip 2 is not enabled (\CE2 is held high) and there will be no need for a possible CSC command, as chip 1 is the destination and source and now receives the CDC command. The process allows for a unified treatment for both on-chip and off-chip copy and is as follows:

1. The controller sends commands to chip 1 to read data from array to buffers; these may be special buffers for this purpose.
2. The controller sends commands and address bytes to chip 1 to configure the chip as an off chip copy source. The address bytes determine the source plane for the data.
3. The controller sends commands and address bytes to chip 1 to configure the chip as an off-chip copy destination. The address bytes determine, e.g., the target plane, block, page and column for the data.
4. The controller can also toggle RE and WE in a synchronized manner to transfer data simultaneously from chip 1 to the controller and back to chip 1 through the bi-directional data buffers. The controller may modify data during the copy by using the same technique that is described in step 4 of example 1. These operations are shown in the timing diagrams below.
5. Once the transfer is complete, the controller sends a command (CDC) to chip 1 to terminate the off chip copy. The range of options for this command is the same as for chip 2 in step 5 of example 1.

FIG. 11 and its variations are also discussed further in the following.

FIG. 5 illustrates the general process in a manner similar to that shown in FIG. 3. FIG. 5 shows two of the arrays that make up the memory. These arrays may be on different chips, as indicated by the broken line, or two semi-autonomous arrays (planes) on the same chip. For the case of on-chip copy where the data is written back to the same plane, array 1 and array 2 can be taken as the same and data register(s) 1 and data register(s) 2 can be taken as the same register.

The process begins by copying a data set from the source location in array 1 into data register(s) 1 associated with array 1. This can be a single register, a more common master-slave arrangement (as in FIG. 3), or some other arrangement. In any of these cases, the data is read out into the part of the register that can receive the copy of data from the array and then any subsequent transfer is made that is needed before the copy of the data can be transferred out to another array or to the controller. (These additional transfers within the data register (s), as from the slave to the master data register in step (2) of FIG. 3, are not explicitly shown in FIG. 5.) The copy of the data is then transferred to the data register(s) 2 associated with destination array 2, including any needed transfers within data register(s) 2 needed to put the data in a register from which it can be written into the destination location.

The data read from the source location is also to be transferred to the controller to be checked and, if needed, corrected. This transfer to a buffer in the controller can occur concurrently with the transfer between data registers and is consequently also labeled as (2). If an error is found in the data set and it is to be corrected, the copy of the data set in the controller's buffer is corrected using the error correction code (ECC). Once corrected, the data set can be sent to data register (s) 2 in step (2'), so that the corrected values can be written to the new location.

When this transfer to the controller is included, it can either be part of all relocations (similar to that described above with respect to FIG. 3 and described further in U.S. Pat. No. 6,266,273) or only for some transfers. Other techniques related to data relocation operations that can be combined with the various aspects of the present invention are found in U.S. patent applications number U.S. Ser. No. 10/846,289, filed May 13, 2004, and number U.S. Ser. No. 10/915,039, filed Aug. 9, 2004, which are hereby incorporated by reference, and U.S. Pat. No. 6,266,273, incorporated by reference above.

As discussed below with respect to FIG. 7, in some cases, even though the majority of the data set is transferred directly from the source to the destination, part of the data set may be modified. For example, the header may be modified. Another aspect of the present invention allows this to be done on the fly, so that the direct transfer from data register 1 to data register 2 is paused in the middle of the transfer and several modified words from the controller are inserted, after the direct transfer may resume.

Once a copy of data is in the write register of the destination array, whether directly from the source array's read buffer, (in corrected form) from the controller, or directly from the source array's read buffer but with some words of the data set modified, it is written into the destination location.

Various aspects of the present invention will be illustrated further through several timing diagrams of exemplary embodiments. Returning to FIG. 6, this shows a basic copy operation between two chips as described above in the first example above. At the start of this sequence, data has been read from the array of chip 1 into its internal buffers. Command CSS (Copy Source Start) and (Source) Address AS define the plane that will be the source for the transfer. Command CDS (Copy Destination Start) and (Destination) Address AD select chip 2 as the chip-to-chip copy destination and define the address (e.g., plane, block, page and column) within the chip where the data will be written. The data transfer in this case does not involve any modification of data. After the data is transferred, commands are issued to chip 1 and chip 2 (CSC and CDC) to complete the transfer. CSC and CDC stand for Copy Source Complete and Copy Destination Complete, respectively.

FIG. 7 shows a case where some words in the middle of the data set are modified during the transfer. For example, this allows for the portions of the header, such as a time stamp, to be updated on the fly as part of the transfer without having to transfer the entire data set to the controller. FIG. 7 shows the process for a fairly standard flash memory interface timing. For the words that will be modified, the WE pulses are stopped to suspend the direct, buffer-to-buffer transfer whilst data is read from the source chip. This data is modified in the controller and then transferred to the destination chip by pulsing WE only. The diagram shows 4 words being modified. Any number of words could be modified in this way and there is no constraint on the location of the modified data in the transfer.

FIG. 8 shows the transfer timing in more detail, again based on a typical flash interface timing. This diagram illustrates a particular detail in managing timing skews, namely the coordination of the rising of \WE and \RE. This shows the three cases, as indicated on the I/O line, of when a data word goes directly from the source buffer to the destination buffer, from the source to the controller, and from the controller to the destination. In the diagram, $t_{REA}$ (read access time) time from when enabled to read until the data is on the bus and $t_{OH}$ (output hold time), the time that the flash chip continues to drive 10 after the rising edge of RE. If there are significant skews present, it would be necessary to lengthen read pulses to ensure that data is correctly strobed into the destination chip. The extent that the read cycles need to be slowed down (if at all) would depend on many factors including capacitive loading, output drive strength of the flash chip I/O lines, and the drive strength and timing resolution of the controller \RE and \WE outputs. In theory, it should be possible to achieve transfer rates equal to the conventional read transfer rate.

In another embodiment, these timing issues could be overcome by having the source flash chip continue to drive the I/O bus whilst RE is high, similar to the way that EDO (extended drive output) DRAM interfaces operate. The timing for this EDO like scheme (for the direct source to destination copy only) is shown in FIG. 9 for several words. The relative timings or \RE and \WE pulses are now much less critical, and it should be possible to achieve much greater transfer rates. In this embodiment, the \RE and \WE waveforms are not skewed with respect to each other and rise and fall together. This EDO like timing could also be used to increase transfer rates for conventional reads, perhaps by using special commands to select transfer modes. With EDO like read timing, transfer rates of 50 MB/sec or better should be achievable. On the I/O line, Dn, Dn+1, Dn+2, . . . , refer to successive words in a data set and the X indicates that the line is driven but undefined.

With EDO like timing, the source flash chip enables its I/O drivers on the falling edge of \RE when ALE, CLE and \CE are low. The flash chip outputs are driven continuously as long as ALE, CLE and \CE remain low.

If it were necessary to modify any data in the EDO like read timing, the flash chip outputs would be disabled. The timing for such operations is shown in FIG. 10, which shows the same three cases as in FIG. 8.

FIGS. 6-10 cover the case of copy between two different chips. Returning to FIG. 11, the second case of a copy between two locations on the same chip is shown. As before, the illustrated sequence starts after the data has been transferred from the array to a buffer. In the exemplary embodiment, two commands are required to initiate the copy, but this time they are issued to the same chip in the manner described above. After the data transfer has completed, a single command can be sufficient to terminate the copy.

If there is no data modification during the data transfer, the sequence for EDO like read timing looks much the same as for FIG. 6 or FIG. 11. When data is modified, the control of the CE line to the source chip needs to be changed. FIG. 12 corresponds to FIG. 7 and shows a copy of data (with modification) between two chips, but now using EDO like read timing. In this case, \CE1 will also be taken high as the data is transferred from the controller to the destination device.

With the scheme as described so far, the optimal performance for copying a block of data will only be reached if the maximum array read and array program parallelism can be achieved. If no constraint is placed on the alignment of data to planes, it would be beneficial to allow array reads to be pipelined with buffer reads using some form of cached read operation. Existing cached reads typically operate on sequential addresses; with two buffers in each plane, it should be possible to start a second array read on one or more planes before transferring data from the first read. In this way, array reads can operate in parallel with data transfers.

For the exemplary embodiment, the interface logic inside the flash chips would be modified from the typical interface logic in order to support the methods described. The extent of the changes would depend on the level of optimization required. The simplest scheme would only allow copy between two chips; this could then make use of existing buffer structures. To support copying back to the source chip, there may be cases where the buffer structures would need modification; in some embodiments, additional buffers may be used. Pipelining of array reads with data transfers may in some cases use extra buffers over and above those provided in existing designs.

The described methods allow very flexible, high performance relocation of data whilst checking and modifying the data on the fly. In additional embodiments, further enhancements could be applied to the array read operations that would allow optimal data copying in all cases. In some cases, these methods would use changes to the operation of flash memory control logic.

The description so far has largely assumed that when the data relocation is between arrays on different chips, that the same bus connects the chips to each other. The methods described to copy data between two memory chips that share a common data bus can be extended to copying data between memory chips on separate busses. This would be the case when, for example, the source and destination memory arrays are not on the same bus and connected to a controller via separate data busses. A modification to the controller design would allow the methods described to be extended to cover this new architecture.

FIG. 13 shows a simple system with two flash data buses (621, 622) and duplicated sets of control signals. Real systems may have more than two buses. The controller 601 is then connected to the two memory chips (611, 612). To copy data between chip 1 611 and chip 2 612, the same sequence of commands is issued as for the single bus case described above; however, as data placed on the bus 621 from chip 611 is not directly accessible to chip 612, it must first be transferred onto bus 622. The controller 601 is set up to transfer data read on bus 1 621 to bus 2 622 with a one cycle delay. Thus, each word of the data set is available to destination chip one cycle after it is placed on the bus connected to the source chip. The data set itself being transferred is never buffered as a whole in the controller, but only passes through the switch 603 a word at a time. This copy mechanism could be used between flash chips of existing design. The design of the crossbar switch 603 would depend on the flexibility required and the number of buses. For example, in some embodiments it would be possible to have say four buses and have simultaneous copying between two pairs of buses.

FIG. 14 shows the timing for the system in FIG. 13 assuming that EDO like read timing is used and corresponds to the single bus case of FIG. 9. The conventional read timing could also be used if required. Separate read and write enable signals are now included for each bus, where \RE1 and \WE2 of FIG. 14 taking the respective places of \RE and \WE in FIG. 9, while \RE2 and \WE1 both stay high for the whole process. As shown on the I/O lines, due to the delay at the crossbar switch, the word Dn+1 is on bus 621 when word Dn is on bus 622, and similarly for the other words of the data set. Consequently, the writes to chip 2 start and finish 1 cycle later than the reads from chip 1. Data modification is made possible by suspending write or read cycles as required. The writes to chip 2 are effectively hidden by the reads from chip 1.

Adding the direct connections of the crossbar switch between buses allows a single protocol to be used for copying data between any two locations in a flash memory array independently of the number flash buses involved. As with the single bus case, selected portions of the data set can be modified as part of the transfer process, with extensions to FIG. 14 similar to those shown in FIGS. 7 and 12.

As mentioned above, the discussion so far has referred mainly to embodiments based on flash EEPROM memory cells and have been described with respect to the type of cell that utilizes conductive floating gates as charge storage elements. However, the various aspects of the present invention can be used in conjunction with the various alternate non-volatile memory technologies (such as thin film, MRAM, FRAM, NMOS, etc.) described in U.S. patent application Ser. No. 10/841,379 filed May 7, 2004, which is hereby incorporated by reference. For example, the invention may also be implemented in a system that uses a charge trapping dielectric as the storage elements in individual memory cells in place of floating gates. Dielectric storage elements are also discussed further in the U.S. patent application serial number U.S. Ser. No. 10/280,352, filed Oct. 25, 2002, which is hereby incorporated by this reference.

Although the invention has been described with respect to various exemplary embodiments, it will be understood that the invention is entitled to protection within the full scope of the appended claims.

It is claimed:

1. A memory system, comprising:
   a plurality of memory chips, each including:
      a memory array; and
      a read/write buffer associated with the memory array;
   a controller for managing data stored in the memory system and controlling the transfer of data within the memory system; and
   a bus connectable to the controller and the memory arrays for the transfer of data within the memory system,
   wherein the controller can select any of said arrays as a source array and any of the other of said arrays as a destination array for a transfer of a page of data between the respective buffers of said source and destination arrays along said bus a subunit of said page at a time, and wherein the controller can modify selected subunits in the controller as part of said transfer without temporarily storing the non-selected subunits in the controller as part of said transfer.

2. The memory system of claim 1, wherein said transfer is performed using an EDO-type timing.

3. The memory system of claim 1, wherein concurrently with transferring a page of data between the respective buffers of said source and destination arrays, the controller can copy said page of data to the controller and therein perform an error detection and correction operation on the copy of said page.

4. The memory system of claim 3, wherein subsequently to performing an error detection and correction operation on the copy of said page, the controller can transfer a corrected copy of said page to the respective buffer of said destination array.

5. The memory system of claim 1, wherein the controller can transfer said page of data to the buffer of said destination array when the destination array is busy with a programming operation.

6. A method of operating a memory system, the memory system comprising a plurality of memory chips, each of which includes a memory array and a read/write buffer associated with the memory array, a controller for managing data stored in the memory system and controlling the transfer of data within the memory system, and a bus connectable to the controller and the memory arrays for the transfer of data within the memory system, the method comprising:
   selecting the array of a first of the memory chips as a source by the controller;
   selecting the array of a second of the memory chips as a destination by the controller, wherein the first and second memory chips can be any of said plurality of memory chips;
   transferring a page of data between the respective buffers of said source and destination arrays along said bus a subunit of said page at a time;
   selecting by the controller of one or more of the subunits by the controller; and
   modifying the selected subunits in the controller as part of said transfer without temporarily storing the non-selected subunits in the controller as part of said transfer.

7. The method of claim 6, wherein said transfer is performed using an EDO-type timing.

8. The method of claim 6, further comprising:
   concurrently with transferring the page of data between the respective buffers of said source and destination arrays, copying said page of data to the controller and performing therein an error detection and correction operation on the copy of said page.

9. The method of claim 8, further comprising:
   subsequently to performing an error detection and correction operation on the copy of said page, transferring a corrected copy of said page to the respective buffer of said destination array.

10. The method system of claim 6, wherein the controller transfers said page of data to the buffer of said destination array when the destination array is busy with a programming operation.

* * * * *